(12) United States Patent
Lim

(10) Patent No.: US 8,452,549 B2
(45) Date of Patent: May 28, 2013

(54) APPARATUS FOR DETECTING ERRONEOUS CABLE STRIPPING

(75) Inventor: Sung Joo Lim, Suwon-si (KR)

(73) Assignee: KM Digitech Co., Ltd., Suwon-si (KR)

( * ) Notice: Subject to any disclaimer, the term of this patent is extended or adjusted under 35 U.S.C. 154(b) by 303 days.

(21) Appl. No.: 12/753,950

(22) Filed: Apr. 5, 2010

(65) Prior Publication Data
US 2011/0246095 A1 Oct. 6, 2011

(51) Int. Cl.
*G01L 5/00* (2006.01)

(52) U.S. Cl.
USPC .................................. 702/41; 702/35; 702/43

(58) Field of Classification Search
None
See application file for complete search history.

(56) References Cited

U.S. PATENT DOCUMENTS

| | | | |
|---|---|---|---|
| 3,527,124 A | 9/1970 | Ullman | |
| 5,375,485 A | 12/1994 | Hoffa | |
| 5,398,561 A | * 3/1995 | Tamura | 73/865.9 |
| 5,460,069 A | * 10/1995 | Sayyadi et al. | 83/171 |
| 5,526,717 A | * 6/1996 | Koch | 81/9.51 |
| 5,950,505 A | * 9/1999 | Locher | 81/9.51 |

FOREIGN PATENT DOCUMENTS

| | | |
|---|---|---|
| DE | 4036443 A1 | 5/1992 |
| JP | 07-236214 A | 9/1995 |
| JP | 2000-184542 A | 6/2000 |
| JP | 2008-061459 A | 3/2008 |
| JP | 2008-295209 A | 12/2008 |
| KR | 0121046 | 10/1998 |
| KR | 10-2001-0046986 A | 6/2001 |
| KR | 10-2008-0021066 A | 3/2008 |

* cited by examiner

*Primary Examiner* — Elias Desta

(74) *Attorney, Agent, or Firm* — Rothwell, Figg, Ernst & Manbeck, P.C.

(57) ABSTRACT

An apparatus for detecting erroneous cable stripping includes an auxiliary bracket having a stripping blade coupled thereto to cut a part of a sheath of a cable to strip the cable, a sensor attached to the auxiliary bracket to sense bending deformation of the auxiliary bracket occurring when tensile force is applied to the cable to strip the cable, and a central processing unit configured to receive a signal sent in response to bending deformation of the auxiliary bracket and determine whether the cable has been stripped erroneously or not.

5 Claims, 6 Drawing Sheets

APPARATUS FOR DETECTING ERRONEOUS CABLE STRIPPING

BACKGROUND OF THE INVENTION

1. Field of the Invention

The present invention relates to an apparatus for detecting erroneous cable stripping and, more particularly, to an apparatus for detecting erroneous cable stripping, which serves to prevent erroneously stripped cables from being inserted into automobiles and home appliances, thereby reducing the possibility of malfunction caused by harnesses.

2. Description of Related Art

As is generally known in the art, when a cable is used for a harness, for example, part of the cable is cut using a blade to remove the sheath, and the exposed core portion is fastened to a terminal of the harness.

In an attempt to improve on manual stripping operations, automated equipment using cutters actuated by driving motors has recently been proposed. However, this approach still has a problem in that some cables are stripped erroneously. FIGS. 1(a)-(d) show front views of cables 300 showing various types of cable stripping errors. Specifically, in FIG. 1(a) only part of the cable sheath 310 is stripped; in FIG. 1(b) part of the core 320 is cut; in FIG. 1(c) none of the cable is stripped; and in FIG. 1(d) both the sheath 310 and the core 320 are completely cut. These types of stripping errors occur if the automated equipment is not operated skillfully, if the stripping blade has been damaged, or if the removed sheath sticks to the stripping blade.

Such erroneous cable stripping is difficult to spot with the naked eye. If an erroneously stripped cable is fastened to a terminal, the manufacturing cost increases unnecessarily. Furthermore, if an abnormally stripped cable is fastened to a terminal and inserted into an automobile or a home appliance, it usually causes a malfunction.

The information disclosed in this Description of Related Art section is only for the enhancement of understanding of the background of the invention.

BRIEF SUMMARY OF THE INVENTION

Various aspects of the present invention provide an apparatus for detecting erroneous cable stripping, which has a sensor for detecting the movement of a stripping blade during cable stripping so that any erroneous cable stripping can be detected.

In an aspect of the present invention, the apparatus for detecting erroneous cable stripping includes an auxiliary bracket having a stripping blade coupled thereto to cut a part of a sheath of a cable to strip the cable; a sensor attached to the auxiliary bracket to sense bending deformation of the auxiliary bracket occurring when tensile force is applied to the cable to strip the cable; and a Central Processing Unit (CPU) configured to receive a signal sent in response to bending deformation of the auxiliary bracket and determine whether the cable has been stripped erroneously or not.

The apparatus can further include an amplifier configured to receive the signal sent in response to bending deformation of the cable from the sensor, amplify the signal, and transmit the signal to the CPU.

A standard value range to be compared with the signal amplified by the amplifier can be entered into the CPU, which determines that a signal deviating from the standard value range indicates erroneous stripping.

The apparatus can further include a monitor configured to display a graph representing the signal amplified by the amplifier and the standard value range and inform the user of the determination that the cable has been stripped erroneously.

The apparatus can further include a main bracket having a cutting blade coupled thereto to cut the cable, and a pair of the auxiliary brackets can be mounted on the main bracket so that respective stripping blades are positioned before and after the cutting blade.

According to exemplary embodiments of the present invention as set forth above, the apparatus for detecting erroneous cable stripping can detect an erroneously stripped cable using sensors so that no erroneously stripped cable is unnecessarily fastened to a terminal, thereby minimizing unnecessary expense.

The methods and apparatuses of the present invention have other features and advantages which will be apparent from or are set forth in more detail in the accompanying drawings, which are incorporated herein, and the following Detailed Description of the Invention, which together serve to explain certain principles of the present invention.

DETAILED DESCRIPTION OF THE INVENTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention.

Figure 1A:
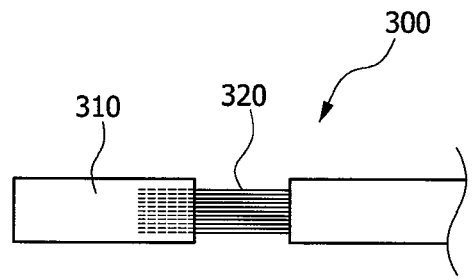
FIGS. 1(a)-(d) show prior art of front views of cables showing various types of cable stripping errors.
Figure 1B:
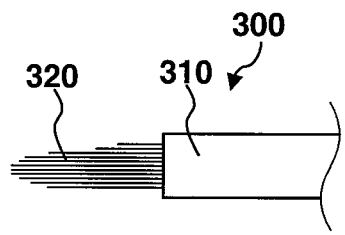
Figure 1C:
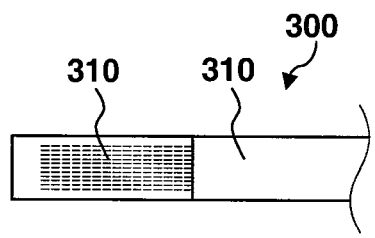
Figure 1D:
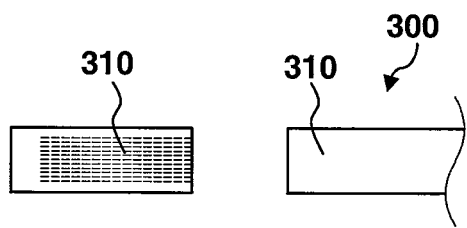
Figure 2:
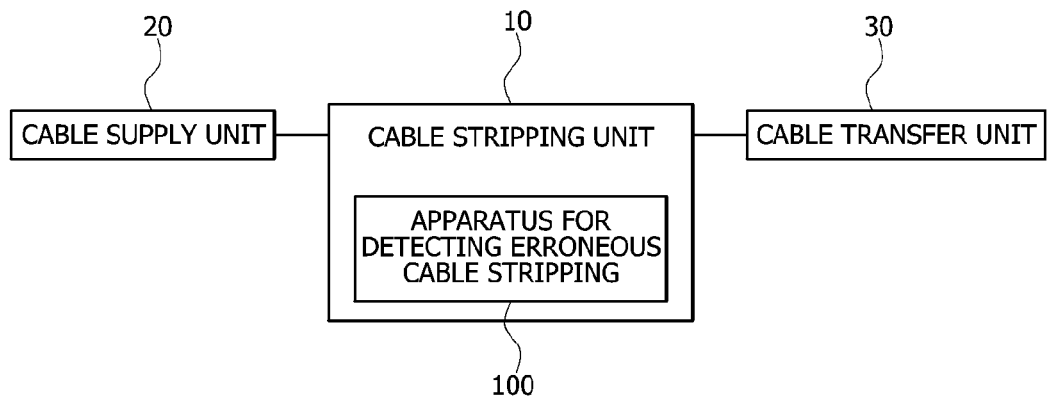
FIG. 2 is a block diagram showing a cable stripping apparatus according to an exemplary embodiment of the present invention.
Figure 3:
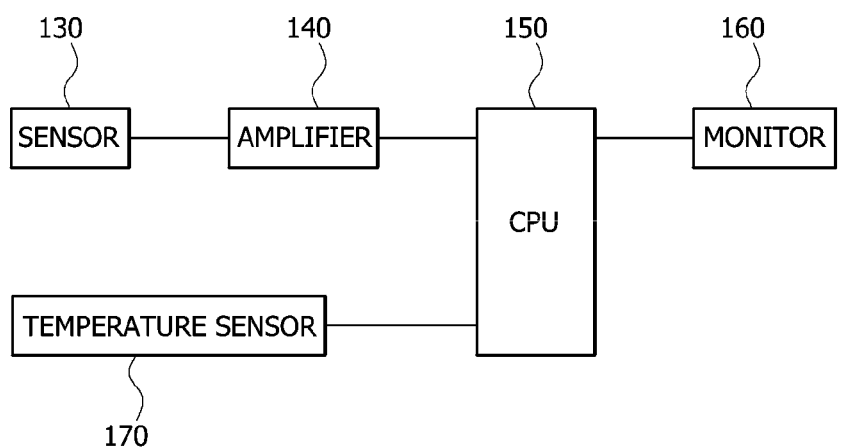
FIG. 3 shows the construction of a cable stripping unit according to an exemplary embodiment of the present invention.
Figure 4:
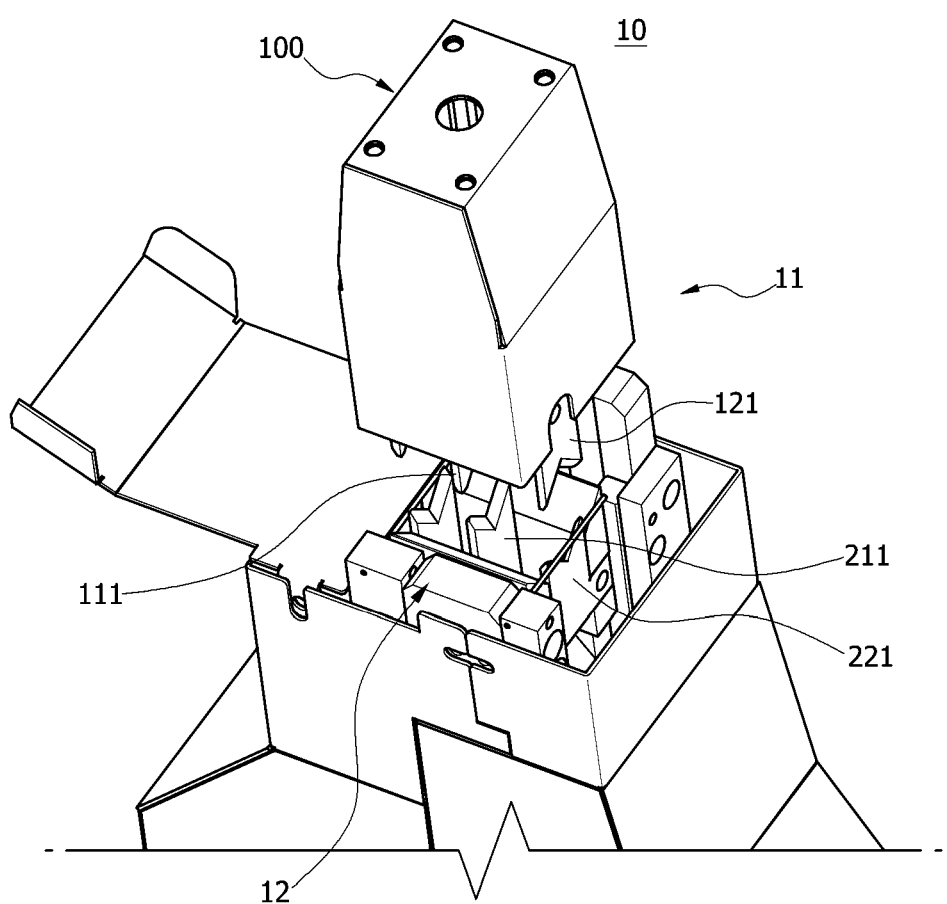
FIG. 4 is a partially-broken view showing the schematic construction of an apparatus for detecting erroneous cable stripping according to an exemplary embodiment of the present invention.
Figure 5:
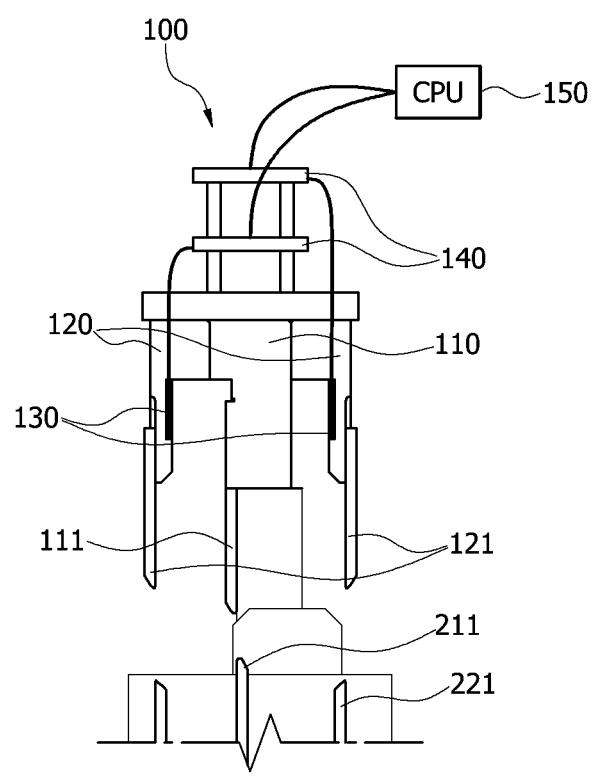
FIG. 5 shows an apparatus for detecting erroneous cable stripping according to an exemplary embodiment of the present invention.

FIG. 2 is a block diagram showing a cable stripping apparatus according to an exemplary embodiment of the present invention. FIG. 3 shows the construction of a cable stripping unit according to an exemplary embodiment of the present invention. FIG. 4 is a partially-broken view showing the schematic construction of an apparatus for detecting erroneous cable stripping according to an exemplary embodiment of the present invention. FIG. 5 shows an apparatus for detecting erroneous cable stripping according to an exemplary embodiment of the present invention.

Referring to FIG. 2, a cable stripping apparatus according to an exemplary embodiment of the present invention includes a cable supply unit 20, a cable stripping unit 10, and a cable transfer unit 30.

The cable supply unit 20 is configured to supply a cable at a predetermined speed and move the cable forward/backward so that the front end of the cable is moved forward or backward by a predetermined distance, and after the movement, the length of the front end to be stripped is adjusted.

The cable transfer unit 30 is configured to receive and hold the front end of the cable, which has been processed by the cable stripping unit 10. The cable transfer unit 30 moves the received cable forward/backward so that the rear end of the cable is moved forward or backward by a preset distance, and after the movement, the length of the rear end to be stripped is adjusted.

The cable stripping unit 10 is configured to cut the cable, which has been received from the cable supply unit 20, and strip the front end of the rear cable. In addition, the cable stripping unit 10 strips the rear end of the front cable received from the cable transfer unit 30. The cable stripping unit 10 may include an apparatus for detecting erroneous cable stripping 100.

Referring to FIG. 4, the cable stripping unit 10 includes a first body 11, a second body 12, and an actuating device (not shown) configured to move the first and second bodies 11 and 12 upward/downward. A cutting blade 111 and a stripping blade 121, which face downward, are fixed to the first body 11, and a cutting blade 211 and a stripping blade 221, which face upward, are fixed to the second body 12.

The downward-facing cutting blade 111 is mounted on a main bracket 110 and fixed to the first body 11. Auxiliary brackets 120 having downward-facing stripping blades 121 coupled thereto are mounted before and after the main bracket 110, respectively.

The upward-facing cutting blade 211 is fixed to the second body 12 so as to correspond to the downward-facing cutting blade 111. Although the upward-facing cutting blade 211 is directly fixed to the second body 12 according to the present invention, it may be mounted on and fixed to a separate second main bracket (not shown). The upward-facing stripping blades 221 are fixed before and after the upward-facing cutting blade 211 so as to correspond to the downward-facing stripping blades 121. The upward-facing stripping blades 221 are either directly fixed to the second body 12, or are mounted on separate second auxiliary brackets (not shown) and mounted.

The apparatus for detecting erroneous cable stripping includes sensors 130 mounted on the auxiliary brackets 120, amplifiers 140 mounted on the main bracket 110, and a Central Processing Unit (CPU) 150 configured to compare signals from the sensors with previously entered values to detect erroneous stripping.

The sensors 130 are attached to the auxiliary brackets 120, to which the downward-facing stripping blades 121 are coupled. The sensors 130 sense minute bending deformation of the auxiliary brackets 120, which are subjected to force acting on the stripping blades 121 when stripping a cable, and detect erroneous stripping.

The sensors 130 are attached to both auxiliary brackets 120, positioned before and after the main bracket 110, respectively, to detect any cable having an erroneously stripped front/rear end.

The amplifiers 140 are positioned on top of the main bracket 110 and are connected with the sensors 130. Two amplifiers 140 are connected to the sensors 130, which are attached inside the auxiliary brackets 120, respectively, to amplify minute signals sensed by the sensors 130.

When the CPU 150 is configured to measure signals sensed by the sensors 130, signals may be directly transferred to the CPU 150 without being amplified by the amplifiers 140.

The amplified signals are transmitted to the CPU 150. The CPU 150 has a range of standard values entered to serve as a reference for detecting erroneously stripped cables. The standard values are obtained by sampling a predetermined number of cables, measuring the amount of deformation of the stripping blades caused by stripping tensile force, and calculating the average.

The more cables are sampled, the more accurately cables are stripped. The stripping tensile force varies depending on the cable thickness. Therefore, when cables of different thicknesses are to be stripped, signals generated when the first sample cable is stripped are analyzed to adjust the signal amplification ratio. When the CPU 150 receives a signal deviating from the range of standard values with reference to standard values within a predetermined allowable error range, it determines that the cable has been stripped erroneously.

Figure 6:
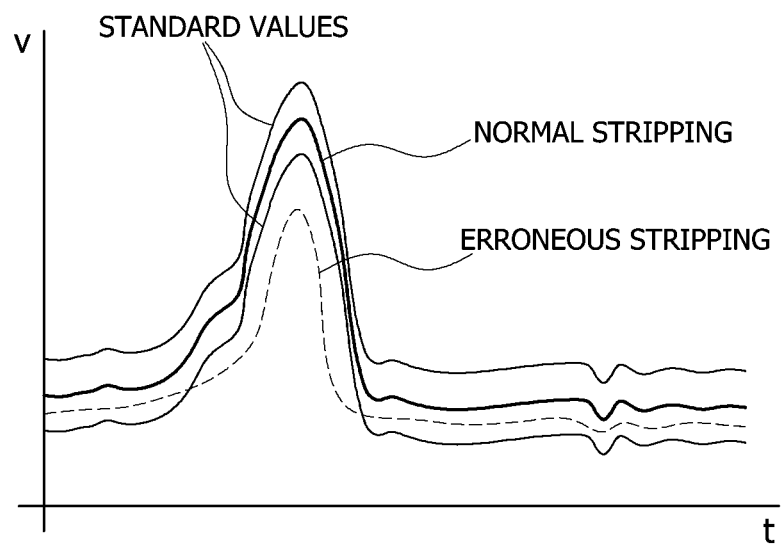
FIG. 6 shows an exemplary stripping graph displayed on a monitor unit during erroneous cable stripping detection according to an exemplary embodiment of the present invention.

The allowable error range may be varied according to the stripping accuracy required by the operator, and the smaller the allowable error range is, the higher the stripping accuracy becomes. As shown in FIG. 6, the standard values within the allowable error range entered into the CPU 150 maintain constant values. If a line resulting from a stripping operation lies within the standard value range, the stripping is considered acceptable; if the line lies outside the range, the stripping is considered unacceptable.

The apparatus may further include a monitor 160 for displaying a graph of standard values and measurements of deformation of the stripping blades during the stripping operation so that the user is informed of the status of the stripping operation, as well as the result of the determination of whether the stripping is acceptable or not.

The CPU 150 controls the operation of the cable stripping apparatus so that, if a cable is stripped erroneously, the operation is suspended. The erroneously stripped cable is cut to prevent it from being fastened to a terminal. Alternatively, the cable is collected in a separate case to be separated or distinguished from normally stripped cables.

Figure 7A:
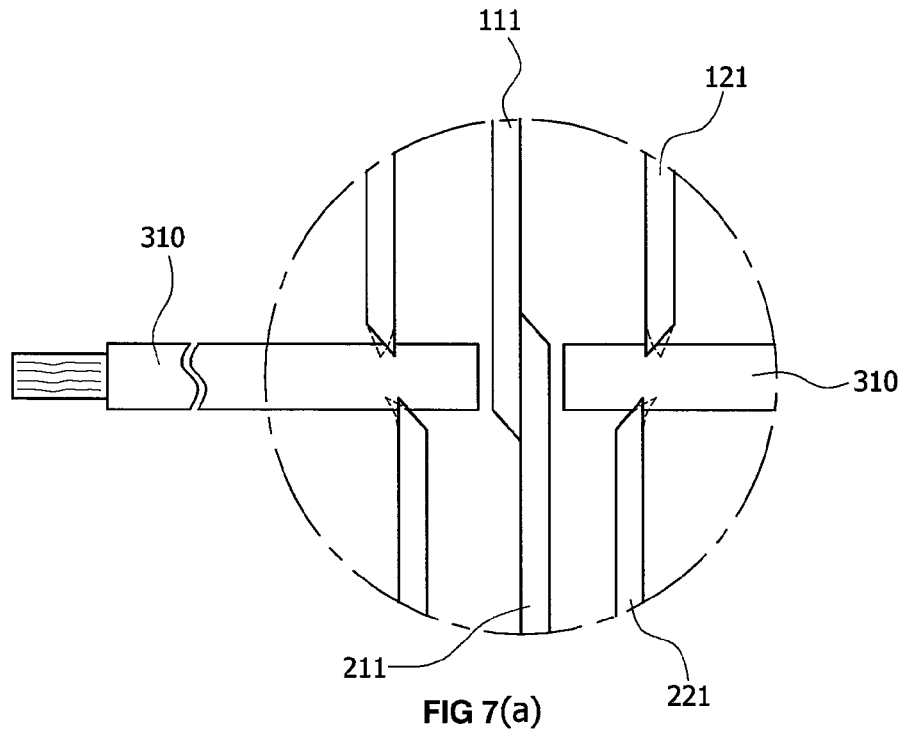
FIGS. 7(a)-(b) are sectional views showing the operating status of an apparatus for detecting erroneous cable stripping according to an exemplary embodiment of the present invention.
Figure 7B:
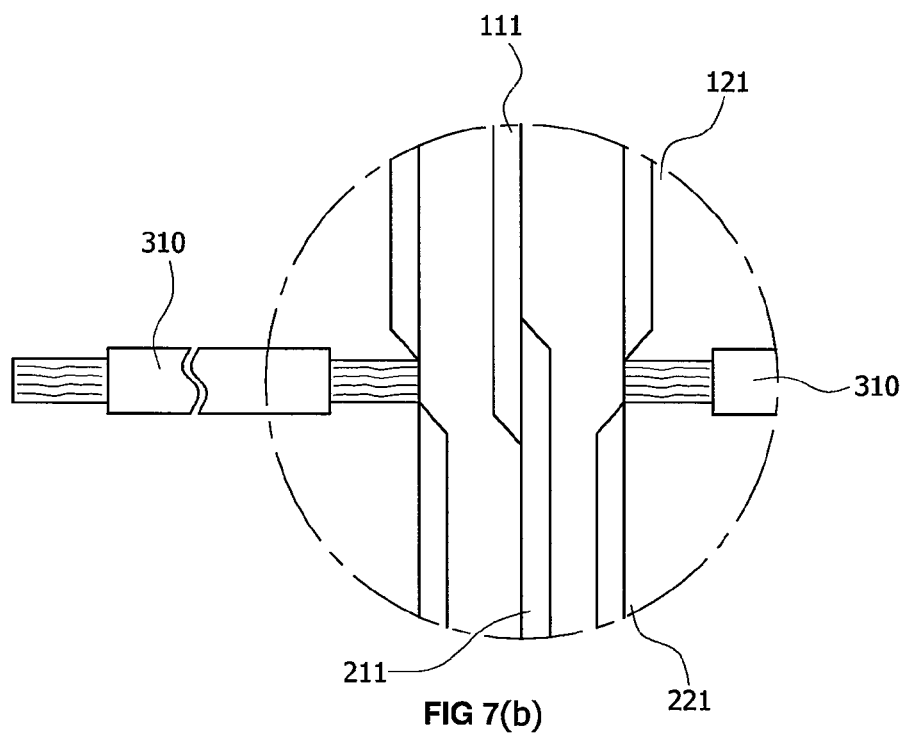

FIGS. 7(a)-(b) are sectional views showing the operation status of an apparatus for detecting erroneous cable stripping according to the present invention. As shown in FIGS. 7(a)-(b), the moment the stripping blades 121 and 221 positioned before and after the cutting blades 111 and 211 cut the sheath 310 of the cable to strip it, the cable moves backward, i.e. in the direction opposite the cable supply direction, so that part of the sheath 310 is removed. The tensile force applied to the sheath 310 as the cable is moved backward and stripped causes temporary minute deformation or vibration of the stripping blades 121 and 221.

The deformation or vibration of the stripping blades 121 and 221 is transmitted to the auxiliary brackets 120, on which the stripping blades 121 and 221 are mounted, and is sensed by the sensors 130, which then generate electric signals and transmit them to the amplifiers 140. The signals are amplified by the amplifiers 140 and transmitted to the CPU 150, which creates a graph of the amplified signals and outputs it to the monitor 160 to be displayed.

A temperature sensor 170 may be used so that any temperature change, which heavily influences the sensors 130, is compensated for, thereby preventing degradation of sensitivity of the sensors 130.

The CPU 150 compares/calculates signals from the amplifiers 140 with standard values within an allowable error range, which have been entered into the CPU 150, to determine whether each cable has been stripped erroneously or not. If it is determined that the cable has been stripped acceptably, the operation continues; if not, the operation of the cable stripping apparatus is suspended, and a message announcing the erroneous stripping is provided audibly or visually through the monitor 160. The user confirms that the cable has been stripped erroneously and disposes of it. The cable stripping apparatus is then restarted (refer to FIGS. 5 and 6).

As such, any erroneously stripped cable is detected by the above-mentioned construction and operation so that no abnormally stripped cable is unnecessarily fastened to a terminal. This avoids unnecessary expense.

Furthermore, positioning of stripping blades before and after the main bracket, to which the cutting blade is coupled, improves operating efficiency and increases throughput.

The foregoing descriptions of specific exemplary embodiments of the present invention have been presented for the purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. An apparatus for detecting erroneous cable stripping, comprising:

an auxiliary bracket having a stripping blade coupled thereto, wherein the auxiliary bracket cuts a part of a sheath of a cable to strip the cable;

a sensor attached to the auxiliary bracket, wherein the sensor senses bending deformation of the auxiliary bracket occurring when tensile force is applied to the cable to strip the cable; and a central processing unit configured to receive a signal sent in response to bending deformation of the auxiliary bracket, wherein the signal comprises a measurement of the amount of deformation of the stripping blades, and to determine whether the cable has been stripped erroneously or not.

2. The apparatus according to claim 1, further comprising an amplifier configured to receive the signal sent in response to bending deformation of the cable from the sensor, amplify the signal, and transmit the signal to the central processing unit.

3. The apparatus according to claim 2, wherein a standard value range to be compared with the signal amplified by the amplifier is entered into the central processing unit, and the central processing unit is configured to determine that a signal deviating from the standard value range indicates erroneous stripping, wherein the standard range value is associated with a measurement of the amount of deformation of the stripping blades.

4. The apparatus according to claim 2, further comprising a monitor configured to display a graph representing the signal amplified by the amplifier and a standard value range and inform a user of a determination that the cable has been stripped erroneously.

5. The apparatus according to claim 1, wherein further comprising a main bracket having a cutting blade coupled thereto to cut the cable, wherein a pair of auxiliary brackets is mounted on the main bracket so that respective stripping blades are positioned before and after the cutting blade.

* * * * *